US011728822B2

United States Patent
Mehdizad Taleie et al.

(10) Patent No.: US 11,728,822 B2
(45) Date of Patent: Aug. 15, 2023

(54) DIGITAL AMPLITUDE TRACKING CURRENT STEERING DIGITAL-TO-ANALOG CONVERTER

(71) Applicant: QUALCOMM Incorporated, San Diego, CA (US)

(72) Inventors: Shahin Mehdizad Taleie, San Diego, CA (US); Dongwon Seo, San Diego, CA (US); Ashok Swaminathan, Cardiff, CA (US); Gurkanwal Singh Sahota, San Diego, CA (US); Andrew Weil, San Diego, CA (US); Haibo Fei, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 17 days.

(21) Appl. No.: 17/359,918

(22) Filed: Jun. 28, 2021

(65) Prior Publication Data
US 2022/0416804 A1    Dec. 29, 2022

(51) Int. Cl.
| | | |
|---|---|---|
| H03M 1/74 | (2006.01) | |
| H03M 1/46 | (2006.01) | |
| H03M 1/50 | (2006.01) | |
| H03M 1/78 | (2006.01) | |
| H03M 1/00 | (2006.01) | |
| H03M 1/12 | (2006.01) | |

(52) U.S. Cl.
CPC ........... *H03M 1/747* (2013.01); *H03M 1/002* (2013.01); *H03M 1/1295* (2013.01); *H03M 1/466* (2013.01); *H03M 1/502* (2013.01); *H03M 1/742* (2013.01); *H03M 1/785* (2013.01)

(58) Field of Classification Search
CPC ...... H03M 1/747; H03M 1/466; H03M 1/502; H03M 1/785; H03M 1/002; H03M 1/1295; H03M 1/742
See application file for complete search history.

(56) References Cited

U.S. PATENT DOCUMENTS

| | | | |
|---|---|---|---|
| 7,701,373 B2 | 4/2010 | Tokumaru et al. | |
| 7,924,197 B1 | 4/2011 | Liu et al. | |
| 8,547,268 B2 * | 10/2013 | Clara .................. | H03M 1/1061 341/155 |
| 9,819,357 B1 | 11/2017 | Guo et al. | |
| 10,224,947 B2 | 3/2019 | Li et al. | |
| 10,797,720 B2 | 10/2020 | Sung et al. | |
| 10,840,927 B1 * | 11/2020 | Shen .................... | H03M 1/002 |
| 11,043,959 B1 * | 6/2021 | Melanson ............ | H03M 3/376 |
| 2020/0366305 A1 | 11/2020 | Weil et al. | |

OTHER PUBLICATIONS

International Search Report and Written Opinion—PCT/US2022/072698—ISA/EPO—dated Sep. 16, 2022.

* cited by examiner

*Primary Examiner* — Khai M Nguyen
(74) *Attorney, Agent, or Firm* — Patterson + Sheridan LLP

(57) ABSTRACT

Certain aspects of the present disclosure provide a digital-to-analog converter (DAC) system. The DAC system generally includes a plurality of current steering cells, each comprising a current source coupled to at least two current steering switches, wherein control inputs of the at least two current steering switches are coupled to an input path of the DAC system. The DAC system may also include a current source toggle circuit configured to selectively disable the current source of at least one of the plurality of current steering cells, and a feedforward path coupled between the input path and at least one control input of the current source toggle circuit.

30 Claims, 12 Drawing Sheets

DIGITAL AMPLITUDE TRACKING CURRENT STEERING DIGITAL-TO-ANALOG CONVERTER

BACKGROUND

Field of the Disclosure

Certain aspects of the present disclosure generally relate to electronic components and, more particularly, to circuitry for digital-to-analog conversion.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via antennas. A transmitter may include one or more digital-to-analog converters (DACs) configured to convert signals from the digital domain to the analog domain for further processing (e.g., amplification) prior to transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a digital-to-analog converter (DAC) system. The DAC system generally includes a plurality of current steering cells, each comprising a current source coupled to at least two current steering switches, wherein control inputs of the at least two current steering switches are coupled to an input path of the DAC system. The DAC system may also include a current source toggle circuit configured to selectively disable the current source of at least one of the plurality of current steering cells, and a feedforward path coupled between the input path and at least one control input of the current source toggle circuit.

Certain aspects of the present disclosure provide a method for digital-to-analog conversion. The method generally includes: receiving a digital input code via an input path of a DAC; generating, via the DAC, an analog output signal based on the digital input code by controlling at least two current steering switches of each of a plurality of current steering cells based on the digital input code, each current steering cell having a current source coupled to the at least two current steering switches; and selectively disabling, via a current source toggle circuit, the current source of at least one of the plurality of current steering cells based on a feedforward signal received via a feedforward path of the DAC.

Certain aspects of the present disclosure provide an apparatus for digital-to-analog conversion. The apparatus generally includes means for generating an analog output signal based on a digital input code received via an input path, wherein the means for generating includes means for controlling at least two current steering switches of each of a plurality of current steering cells based on the digital input code, each current steering cell having a current source coupled to the at least two current steering switches; and means for selectively disabling the current source of at least one of the plurality of current steering cells based on a feedforward signal received via a feedforward path of the DAC.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques for digital-to-analog conversion. For example, certain aspects provide a digital-to-analog converter (DAC) including current steering cells that may be selectively disabled to reduce power consumption. For example, a digital input code of the DAC may not span the entire digital input range for certain time periods. As a result, during these time periods, one or more current steering cells of the DAC may not be used and may be disabled to reduce power consumption. In some aspects, a control circuit may be used to provide the DAC advance notice that that the input code will have a positive spike or a negative spike, allowing the DAC to enable the previously disabled current steering cells before the arrival of the deviating input code, as described in more detail herein.

EXAMPLE WIRELESS COMMUNICATIONS

Figure 1:
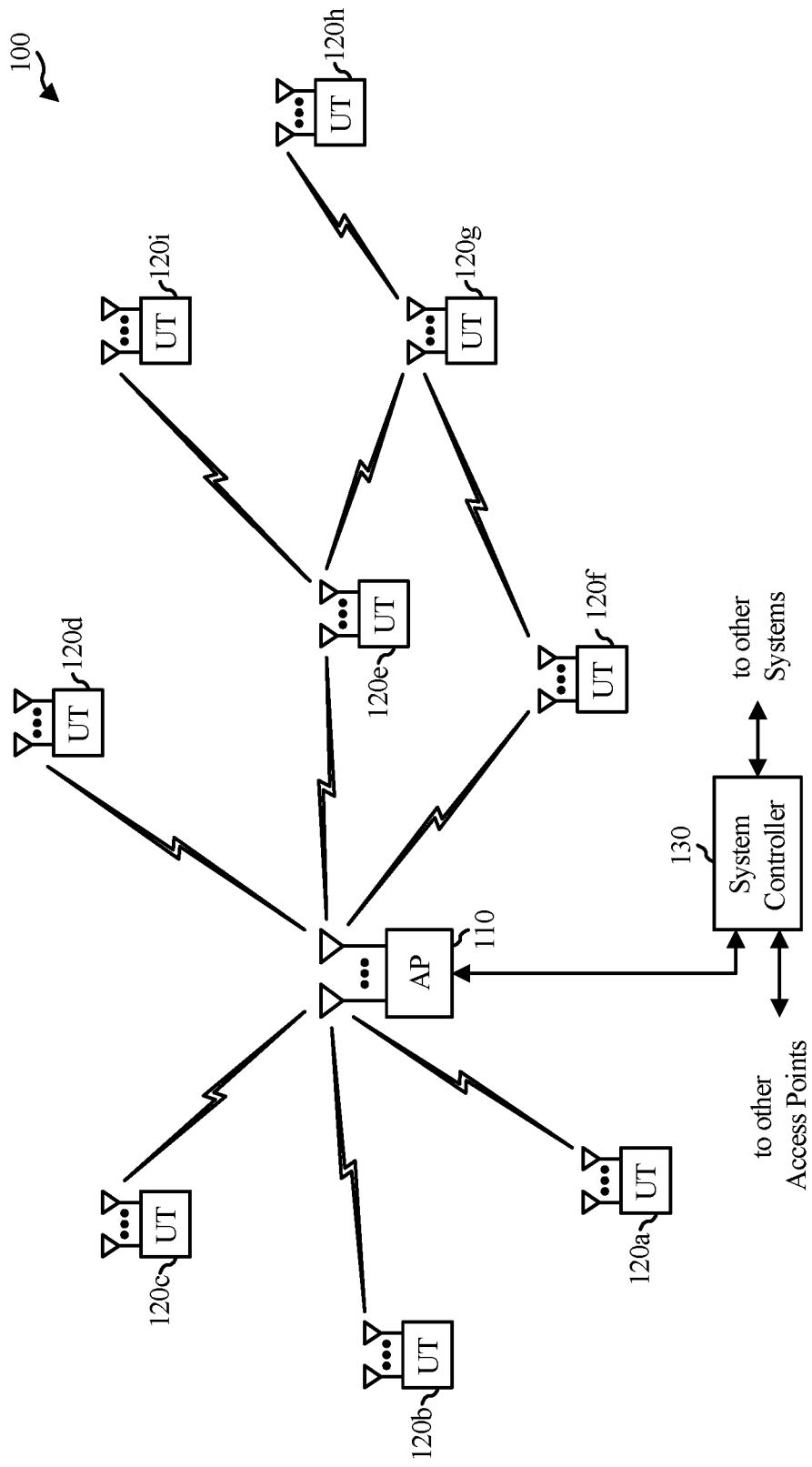
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include a digital-to-analog converter (DAC) implemented with current steering cells that are selectively disabled to reduce power consumption, as described in more detail herein.

Figure 2:
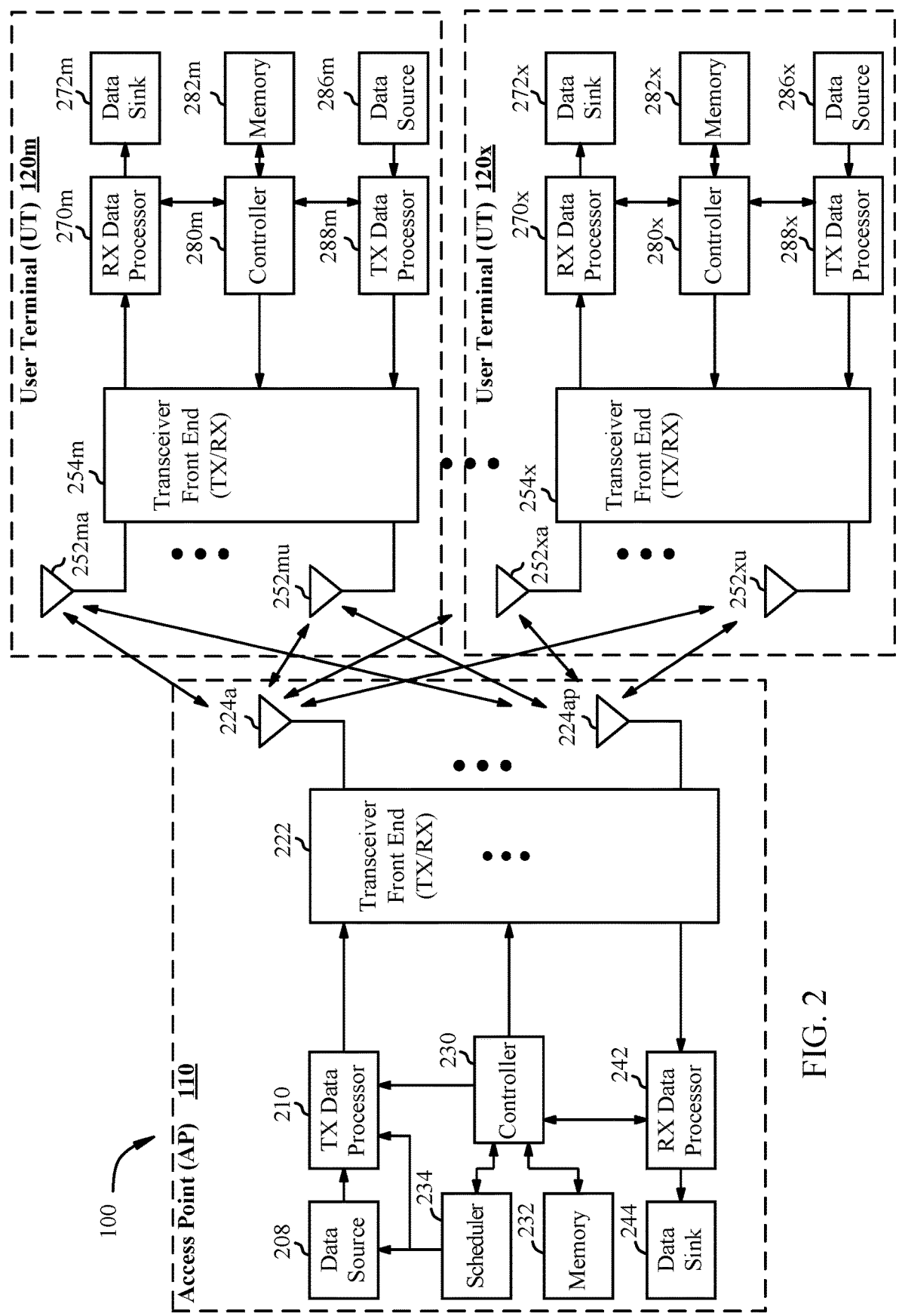
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include a DAC implemented with current steering cells that are selectively disabled to reduce power consumption, as described in more detail herein.

Figure 3:
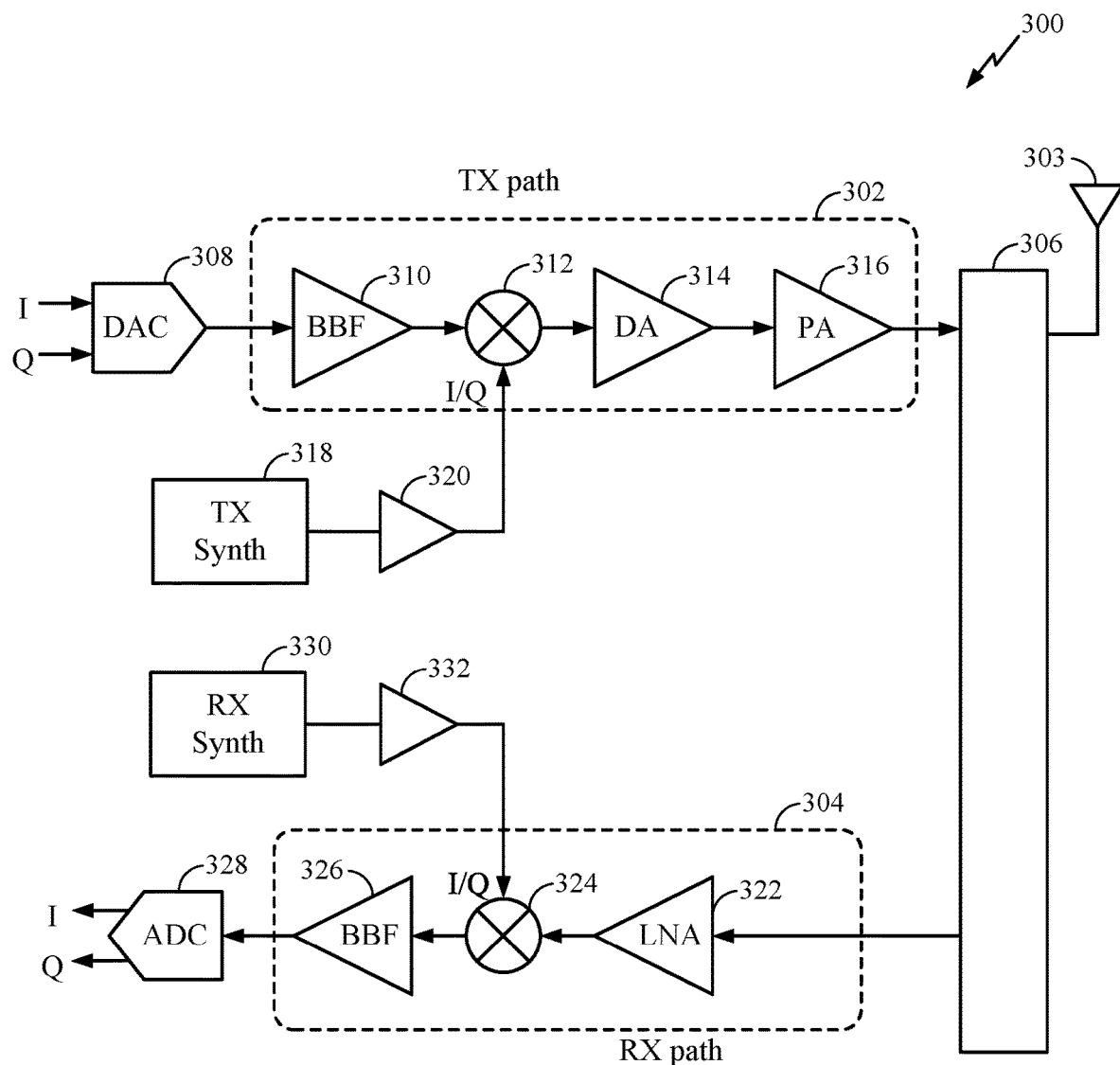
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The DAC 308 may include current steering cells and may be configured to selectively disable one or more of the current steering cells to reduce power consumption, as described in more detail below. The BBF 310, the mixer 312, and the DA 314 may be included in a radio frequency integrated circuit (RFIC), while the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303. In some aspects, the DAC 308 may be implemented with current steering cells that are selectively disabled to reduce power consumption, as described in more detail herein.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Introduction to Digital-to-Analog Conversion Using Current Steering

Current steering digital-to-analog converters (DACs) are the architecture of choice for high performance digital-to-analog conversion in many wireless transmitters. Current steering DACs offer versatility of design, allow high speed operation, and high performance.

Figure 4:
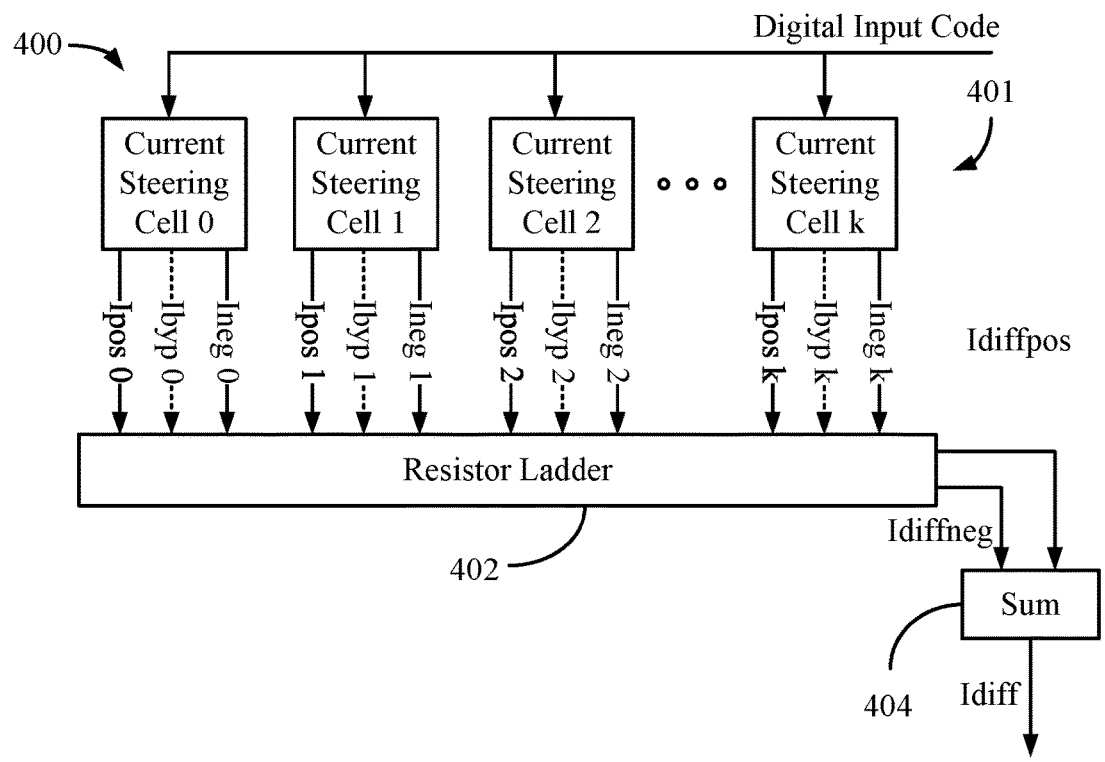
FIG. 4 illustrates an example digital-to-analog converter (DAC), in accordance with certain aspects of the present disclosure.

FIG. 4 illustrates an example current steering DAC 400 (e.g., implemented as the DAC 308 of FIG. 3), in accordance with certain aspects of the present disclosure. Depending on a digital input code, each bit of the DAC 400 associated with a current steering cell may source a positive current (e.g., Ipos 0 to Ipos k, k being an integer greater than 1, where k+1 is the number of cells) or a negative current (e.g., Ineg 0 to Ineg k) to respective outputs depending on the logic level for a respective bit of the digital input code. For example, for a resistor ladder DAC design, the positive and negative currents may be provided to a resistor ladder circuit 402. A "positive current" from a current steering cell generally refers to a current sourced to a positive output node (e.g., a positive ladder node of a resistor ladder circuit), and a "negative current" from a current steering cell generally refers to a current sourced to a negative output node (e.g., a negative ladder node of the resistor ladder circuit). Each of the current steering cells 401 may include switches to selectively provide a respective one of Ipos 0 to Ipos k or a respective one of Ineg 0 to Ineg k to the resistor ladder circuit 402.

The positive currents (Ipos 0 to Ipos k) from the current steering cells 401 contribute mostly to a positive portion (Idiffpos) of a differential output current, and the negative currents (Ineg 0 to Ineg k) from the current steering cells 401 contribute mostly to a negative portion (Idiffneg) of the differential output current of the resistor ladder circuit 402. Idiffpos and Idiffneg may be summed (e.g., via summing circuit 404, or at a summing node) to generate the differential output current (Idiff). The positive or negative current generated by each current steering cell contributes to residual differential errors at the output of the DAC 400. The residual differential errors may be associated with a current source of each of the current steering cells.

Figure 5:
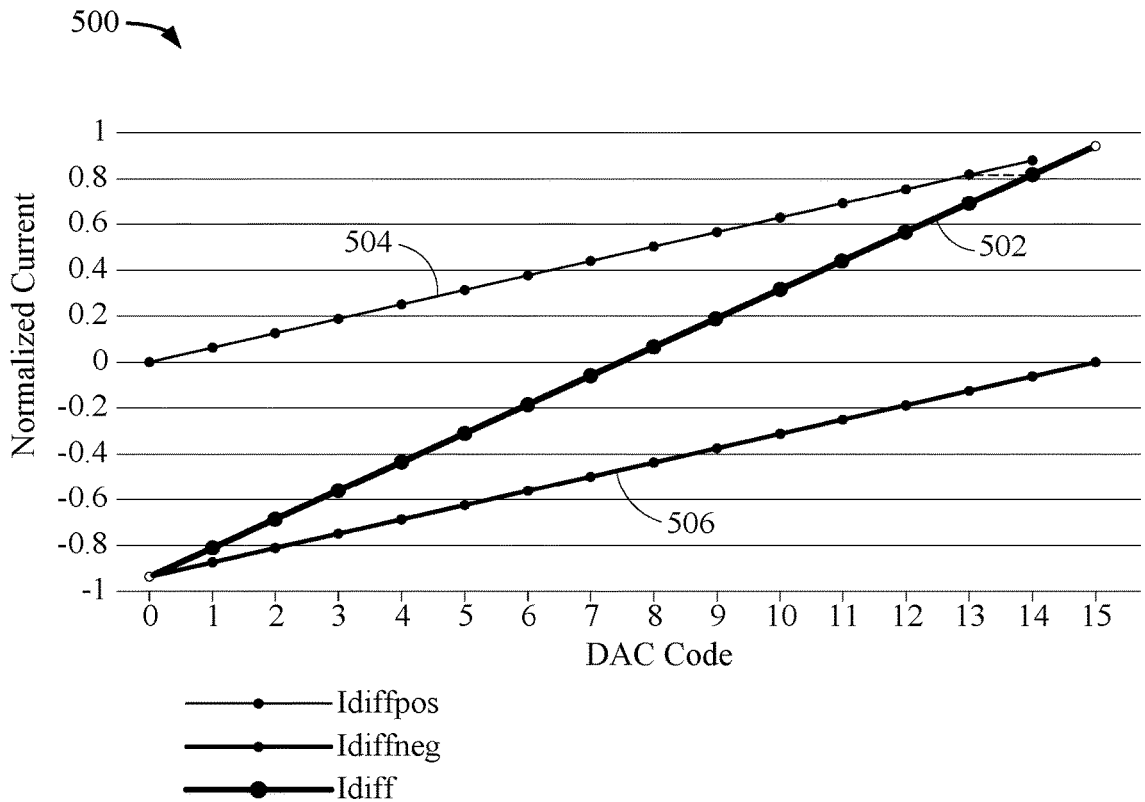
FIG. 5 is a graph illustrating an output current of a DAC, in accordance with certain aspects of the present disclosure.

FIG. 5 is a graph 500 illustrating Idiffpos and Idiffneg for generating Idiff. For example, Idiff 502 of the DAC 400 may be generated based on the sum of Idiffpos 504 and Idiffneg 506. For instance, Idiff associated with input digital code 4 may be generated by the sum of the Idiffpos and Idiffneg associated with input digital code 4, as illustrated.

In some implementations, Idiffpos for input digital code 4 may be generated by positive currents (e.g., Ipos 0 to Ipos 4) via current steering cells 0-4, while the remaining current steering cells 5-15 supply negative currents (e.g., Ineg 5 to Ineg k). Thus, for each of the digital input codes 1-14, the current steering cells 0-15 are supplying either positive or negative current for generating Idiffpos 504 or Idiffneg 506, and contribute to the error at the output of the DAC 400.

In some implementations, these errors may be eliminated (or at least reduced) by converting some of the differential currents provided by the current steering cells to common-mode currents. For example, as illustrated in FIG. 4, each current steering cell may include a bypass signal path, allowing each of the current steering cells to provide a bypass current (Ibyp 0 to Ibyp k) that contributes equally to Idiffpos and Idiffneg. Thus, any error associated with a current steering cell that is providing a bypass current may have little to no impact on the error associated with Idiff at the output of the DAC 400.

Figure 6:
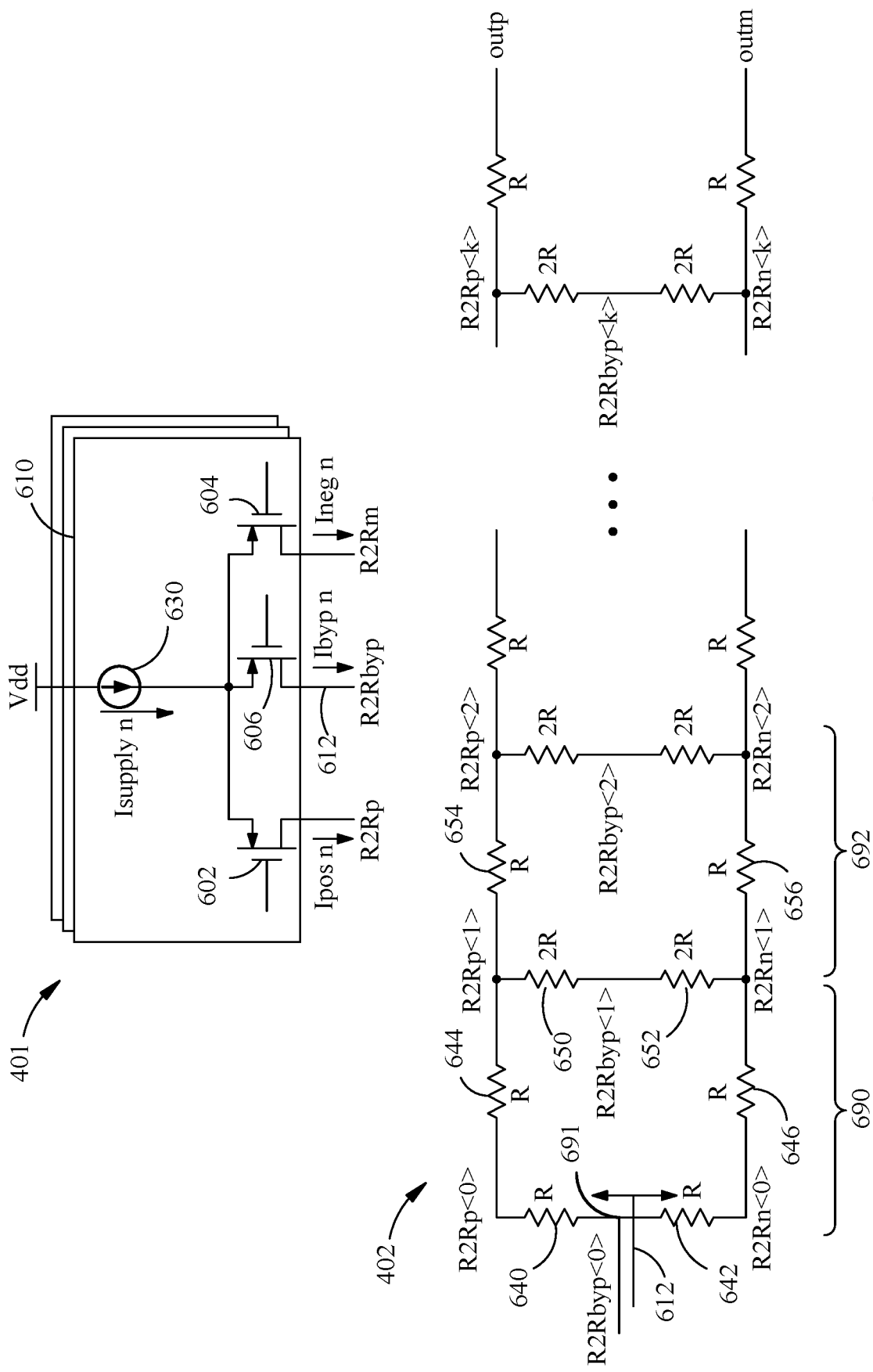
FIG. 6 illustrates current steering cells coupled to a resistor ladder circuit of a DAC, in accordance with certain aspects of the present disclosure.

FIG. 6 illustrates current steering cells 401 and the resistor ladder circuit 402, in accordance with certain aspects of the present disclosure. As illustrated, the resistor ladder circuit 402 may be implemented as an R-2R type ladder circuit. For example, the resistor ladder circuit 402 may include multiple segments (e.g., segments 690, 692), each of the segments including a positive ladder node R2Rp<0> to R2Rp<k> and a negative ladder node R2Rn<0> to R2Rn<k>. Between the positive ladder node and the negative ladder node of each segment may be resistive elements (e.g., resistive elements 640, 642, or resistive elements 650, 652). A bypass ladder node R2Rbyp<0> to R2Rbyp<k> may be coupled between the resistive elements (e.g., resistive elements 640, 642, or resistive elements 650, 652) of each segment, as illustrated. Moreover, a resistive element (e.g., resistive element 644 or 654) may be coupled between the positive nodes of adjacent segments of the resistor ladder circuit 402, and a resistive element (e.g., resistive element 646 or 656) may be coupled between the negative nodes of adjacent segments of the resistor ladder circuit 402.

Each of the current steering cells 401 (e.g., current steering cell n, n being an integer equal to or greater than 1) includes a current source coupled to a voltage rail Vdd, a positive switch for selectively providing a positive current to a positive ladder node, and a negative switch for providing a negative current to a negative ladder node. For example, supply current Isupply 0 (e.g., Isupply n, where n is 0) through the current source 630 may be directed via a positive switch 602 of the current steering cell 610 (e.g., corresponding to current steering cell 0 of FIG. 4) to provide a positive current (e.g., Ipos 0) to the positive ladder node R2Rp<0>. Similarly, Isupply 0 through the current source 630 may be directed via a negative switch 604 to provide a negative current (e.g., Ineg 0) to the negative ladder node R2Rn<0>. In a similar manner, currents from current sources of other current steering cells are directed via positive and negative switches to respective positive and negative ladder nodes (R2Rp<1> to R2Rp<k>, and R2Rn<1> to R2Rn<k>).

The positive switch 602 may be closed to assert a logic high (+1), and the negative switch 604 may be closed to assert a logic low (−1). In certain aspects, each of the current steering cells includes a bypass switch (e.g., bypass switch 606, also referred to as a "common mode dump switch") to allow for a third logic state (0) to be asserted, as described herein. The bypass switches of the current steering cells may supply bypass currents to bypass nodes R2Rbyp<0> to R2Rbyp<k>. For example, the bypass switch may provide a common-mode current. The switch 606 may be coupled to a bypass node (R2Rbyp<0>), and a bypass current 612 (e.g., Ibyp 0) may be sourced from the current steering cell 610. The bypass current 612 may be provided to a common node 691 (also referred to as a bypass node), and may split and flow equally towards positive and negative ladder nodes R2Rp<0> and R2Rn<0>. When the bypass switch 606 is closed, any error associated with the current steering cell 610 due to the current source 630 may equally impact Idiffpos and Idiffneg at the output of the resistor ladder circuit 402 such that the error is cancelled out and does not impact the differential output current Idiff. In some aspects, switches 602, 604, and 606 may be implemented as p-type metal-oxide-semiconductor (PMOS) transistors, as illustrated. Thus, a logic high signal may be used to open the switches 602, 604, and 606, and a logic low signal may be used to close the switches 602, 604, and 606. While a current steering DAC implemented using a resistor ladder circuit is described to facilitate understanding, the aspects described herein may be applied for any suitable current steering DAC.

Example Digital Amplitude Tracking Current Steering DAC

The full-scale current that may be provided by a current steering DAC may have a lower bound and an upper bound.

The lower bound on the full-scale current may be set by thermal noise or settling current specifications. The upper bound may be set by battery power consumption constraints. Current steering DACs offer tradeoffs for allowing maximum differential current during maximum swing and low current during low swings to improve the signal-to-noise ratio (SNR) at low swings by directing current from unused current sources to the common-mode point of the DAC and hence make the noise associated with the current sources common mode, as described with respect to FIG. 6. This scheme improves SNR, but may not result in reduction of power consumption.

As development of next generation transceivers begins, it may be desirable to reduce power consumption. There have been various innovations for reducing power consumption of transceivers. However, the current consumption associated with digital-to-analog conversion has been generally locked in a tradeoff of power consumption versus noise performance. Some aspects of the present disclosure provide techniques for breaking this tradeoff.

Some aspects of the present disclosure are directed to techniques for reducing power consumption by disabling one or more current sources of a current steering DAC and enabling at least some of these previously disabled one or more current sources based on knowledge (or an estimate) of upcoming digital data. In other words, analysis of digital input codes can be used to estimate when the disabled current sources are going to be used for digital-to-analog conversion, and enabling the current sources accordingly.

Figure 7:
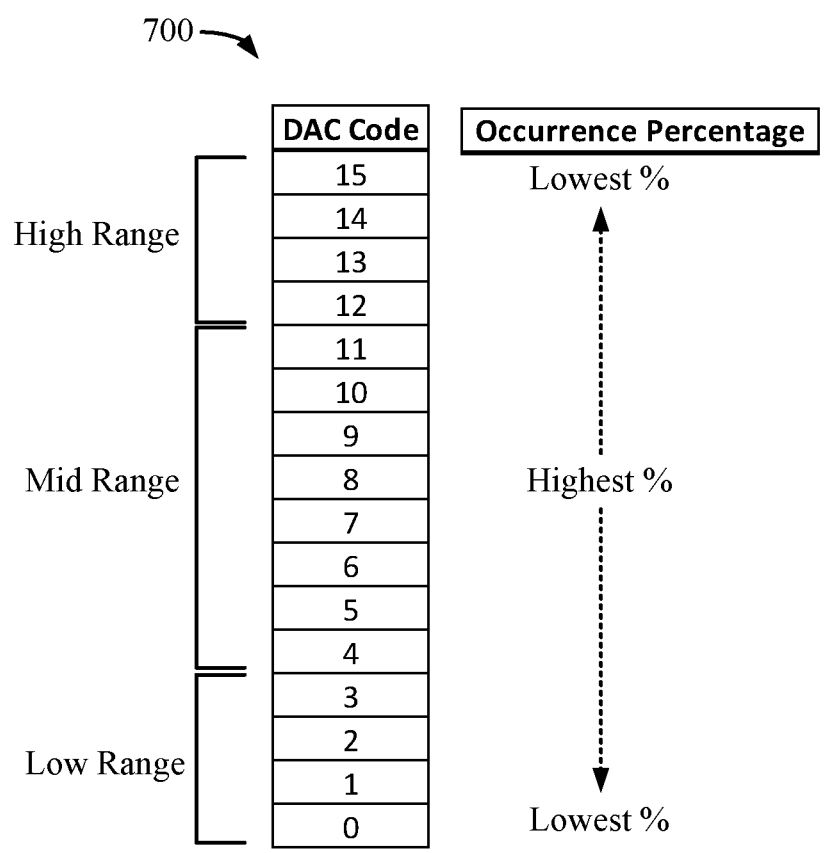
FIG. 7 is a table illustrating example percentages of occurrences of DAC input codes, in accordance with certain aspects of the present disclosure.

FIG. 7 is a table 700 illustrating example percentages of occurrences of DAC input codes for a 16-bit DAC. As illustrated, the low range of DAC codes (e.g., DAC codes 0-3) and high range of DAC codes (e.g., DAC codes 12-15) may occur less often than the midrange of DAC codes (e.g., DAC codes 4-11). While one example range division between the DAC codes is provided in FIG. 7 to facilitate understanding, other suitable range divisions between low, mid, and high DAC code ranges may be used. The digital-to-analog conversion for the low range DAC codes and the high range DAC codes may be performed via a subset of the current steering cells 401). For example, digital-to-analog conversion for low range DAC codes may be performed via current steering cell 0 to current steering cell 4, and digital-to-analog conversion for high range DAC codes may be performed by current steering cells 12 to current steering cell 15. In some aspects of the present disclosure, one or more of the current steering cells associated with the high range of DAC codes, and/or one or more current steering cells associated with the low range of DAC codes may be disabled, and enabled when those particular previously disabled current steering cells are to be used for digital-to-analog conversion. As an example, the current steering cells used to perform digital-to-analog conversion for DAC code values within the midrange may be continuously enabled, and the other current steering cells (or at least a portion thereof) may be disabled until it is estimated that the DAC code value will increase or decrease to the high or low range values, respectively (i.e., selectively enabled).

Different modulation and coding schemes (MCSs) may be associated with different peak-to-average-power ratios (PAPRs). For example, quadrature phase-shift keying (QPSK) and binary phase-shift keying (BPSK) may have a lower PAPR than 64 quadrature amplitude modulation (QAM). Thus, the DAC code for a transmit path configured for 64 QAM may experience positive or negative spikes more often as compared to QPSK and BPSK. As used herein, a positive spike of the DAC code generally refers to an increase of the DAC code into the high range, and a negative spike of the DAC code generally refers to a decrease of the DAC code into the low range.

Figure 8:
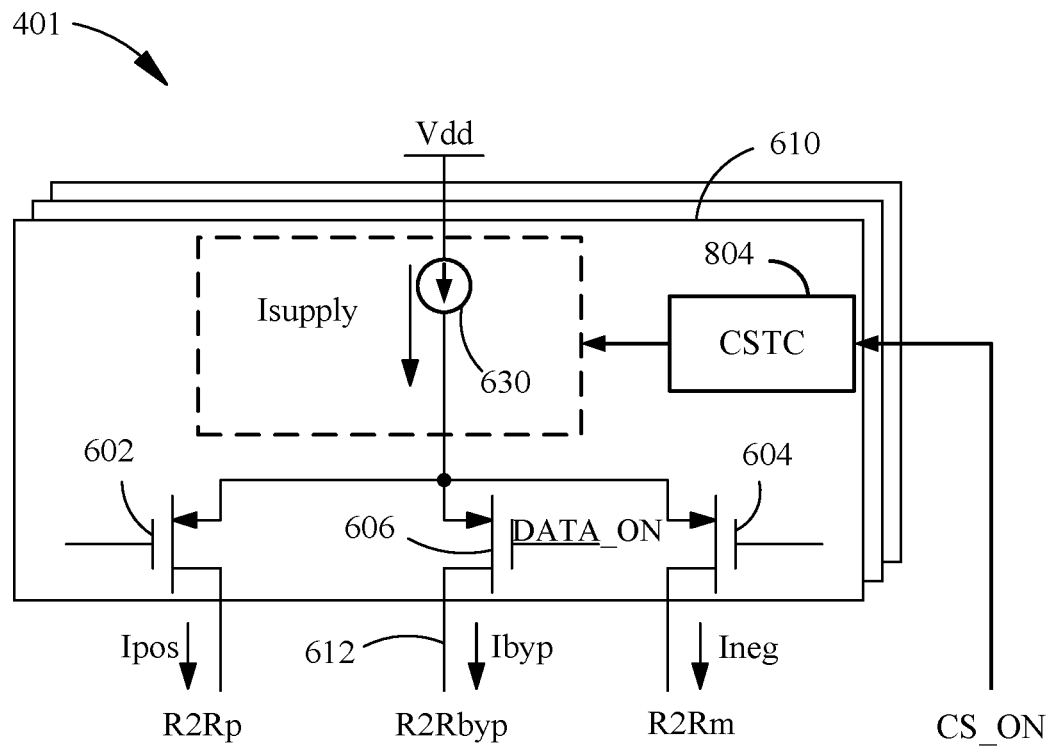
FIG. 8 illustrates current steering cells, each implemented with a current source toggle circuit, in accordance with certain aspects of the present disclosure.
Figure 8:
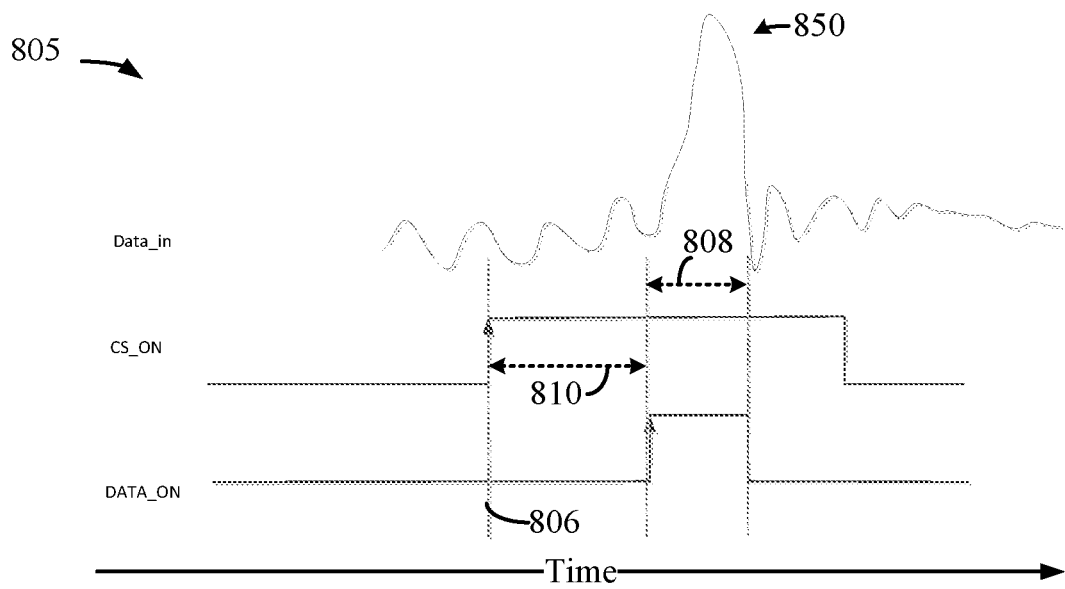

FIG. 8 illustrates current steering cells 401, each implemented with a current source toggle circuit 804 (labeled "CSTC" in FIG. 8), in accordance with certain aspects of the present disclosure. The current source toggle circuit 804 may be configured to selectively enable or disable the current source 630. As illustrated by the timing diagram 805, a CS_ON signal used to control the current source toggle circuit 804 may be logic low such that the current source toggle circuit 804 disables the current source 630. In this manner, the current sources of DAC steering cells associated with digital-to-analog conversion for DAC codes in the low range and the high range may be disabled, to reduce power consumption. For instance, current sources of current steering cells 0-3 and current steering cells 12-15 may be disabled, while the current steering cells 4-11 are operated to implement digital-to-analog conversion for the DAC code while the DAC code is within the midrange of values. While the current sources (e.g., current source 630) of the current steering cells are disabled (e.g., to disable the current steering cell), the bypass switch (e.g., bypass switch 606) of the disabled current steering cells may be closed. Positive and negative switches 602, 604 may be open when the bypass switch 606 is closed.

Certain aspects of the present disclosure are directed to techniques for enabling current steering cells in response to detection of an upcoming deviation (e.g., a spike or other transient) of the DAC code into the high range or the low range. In other words, the current steering cells may be enabled or disabled based on tracking of a digital amplitude associated with the DAC code. For example, upon detection (or estimation) of an upcoming increase or decrease (e.g., positive spike 850) in the DAC code value (represented by the "Data_in" curve of the timing diagram 805), the CS_ON signal may transition to logic high to enable the current source 630 (and effectively turn on the associated current steering cell). That is, at time 806, the CS_ON signal may toggle to logic high based on the estimation that the DAC code value will transition to the high DAC code value range. Once the current source toggle circuit 804 enables the current source 630, it may take some time (e.g., a current source settling period 810 (e.g., 100 to 500 ns), also referred to as a current source settling delay) for the current from the current source 630 to settle to a nominal value. During the current source settling period 810, the bypass switch (e.g., bypass switch 606 controlled via a DATA_ON signal) remains logic low so that any current sourced by the current source 630 flows as a common-mode current, as described with respect to FIG. 6.

After a current source settling period 810, the DATA_ON signal may transition to logic high, opening the bypass switch 606. After the bypass switch 606 is opened, the positive switch 602 may be closed to direct the current from the current source 630 to the positive output of the current steering cell.

A similar process may occur if it is estimated that the DAC code will transition to the low range of the input DAC values. For example, if a negative peak is estimated to occur during the period 808 (e.g., 5-10 ns), a negative switch (e.g., negative switch 604) of a current steering cell may be closed to direct the current from the current source of the current steering cell to the negative output of the current steering cell. While the enabling of the current source is described with respect to a single current steering cell in FIG. 8 to facilitate understanding, one or more current steering cells for the high range of DAC code values (and/or one or more current steering cells for the low range of DAC code values) may be disabled to reduce power consumption, and subsequently enabled in response to the estimation of an upcoming positive spike (or negative spike) of the DAC code.

The bypass switch (e.g., as well as the positive and negative switches) of each current steering cell may have a relatively fast settling time. In other words, at the end of the current source settling period 810, the current from the current source can be quickly redirected from the bypass path to the positive or negative paths. Thus, using knowledge of upcoming digital data, along with the fast settling of the positive, negative, and bypass switches, allows for the enabling of current sources of the highest and lowest current steering cells of the DAC in advance of an upcoming spike in the DAC code value.

Figure 9A:
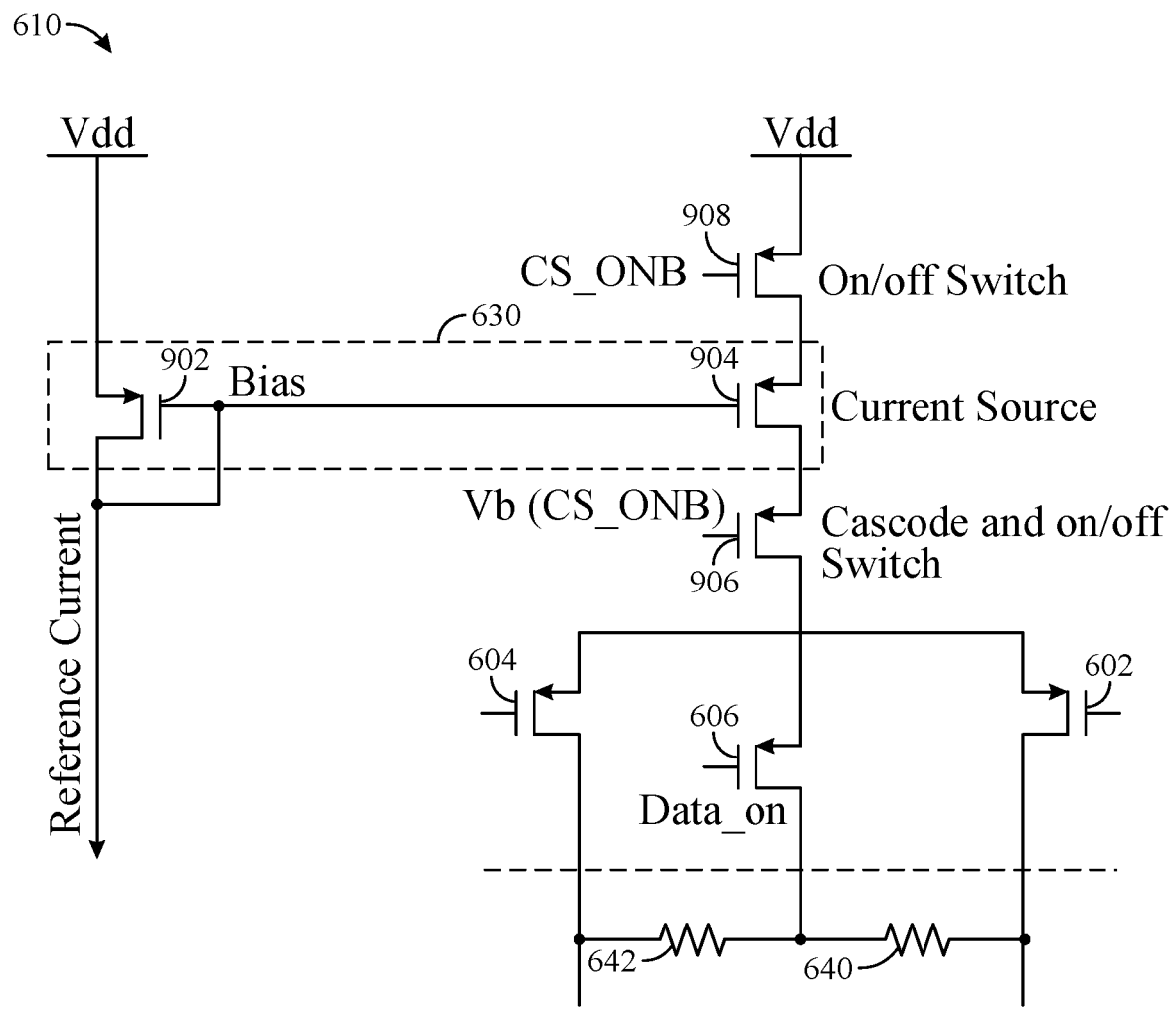
FIG. 9A is a schematic diagram of an example current steering cell, including example circuitry for implementing a current source toggle circuit, in accordance with certain aspects of the present disclosure.

FIG. 9A illustrates example circuitry for implementing the current source toggle circuit 804, in accordance with certain aspects of the present disclosure. As illustrated, the current steering cell includes a transistor 902 (e.g., p-type metal-oxide-semiconductor (PMOS) transistor) having a gate coupled to a gate of a transistor 904 (e.g., PMOS transistor). As shown, transistor 902 may be a diode-connected transistor (e.g., the gate of the transistor 902 may be coupled to the drain of the transistor 902). Thus, the transistor 904 and the transistor 902 form a current mirror. The source-to-drain current of transistor 902 (e.g., reference current) may be mirrored by the current mirror to implement the current source 630.

In some aspects, the current source toggle circuit 804 may include a transistor 906 coupled in cascode with the transistor 904. When the current steering cell 610 is enabled, the transistor 906 may be biased using a biasing voltage (Vb). To selectively disable the current steering cell (e.g., disable current source 630 by turning off the transistor 906), the gate of the transistor 906 may be configured to receive an inverse of the CS_ON signal (CS_ONB signal). Thus, the transistor 906 may be turned off (e.g., be configured as an open switch) by receiving a logic high signal. Moreover, when the current steering cell is disabled, the corresponding bypass switch may be closed using the DATA_ON signal, as described with respect to FIG. 8.

In some aspects, the current source toggle circuit may include a transistor 908 coupled between the voltage rail Vdd and transistor 904. As shown, the gate of the transistor 908 may be configured to receive the CS_ONB signal. Thus, the transistor 908 may operate as a switch that is opened when the current steering cell is disabled. In some aspects, both switches implemented using transistors 906, 908 may be opened to disable the current steering cell to reduce any signal glitch when disabling the current steering cell. While FIG. 9A illustrates one example implementation for disabling a current steering cell to facilitate understanding, other suitable implementations may be used. For example, a switch may be used between gates of the transistors 902, 904 to enable and disable the current source 630, in some cases (e.g., instead of using transistor 906, 908 as described).

Figure 9B:
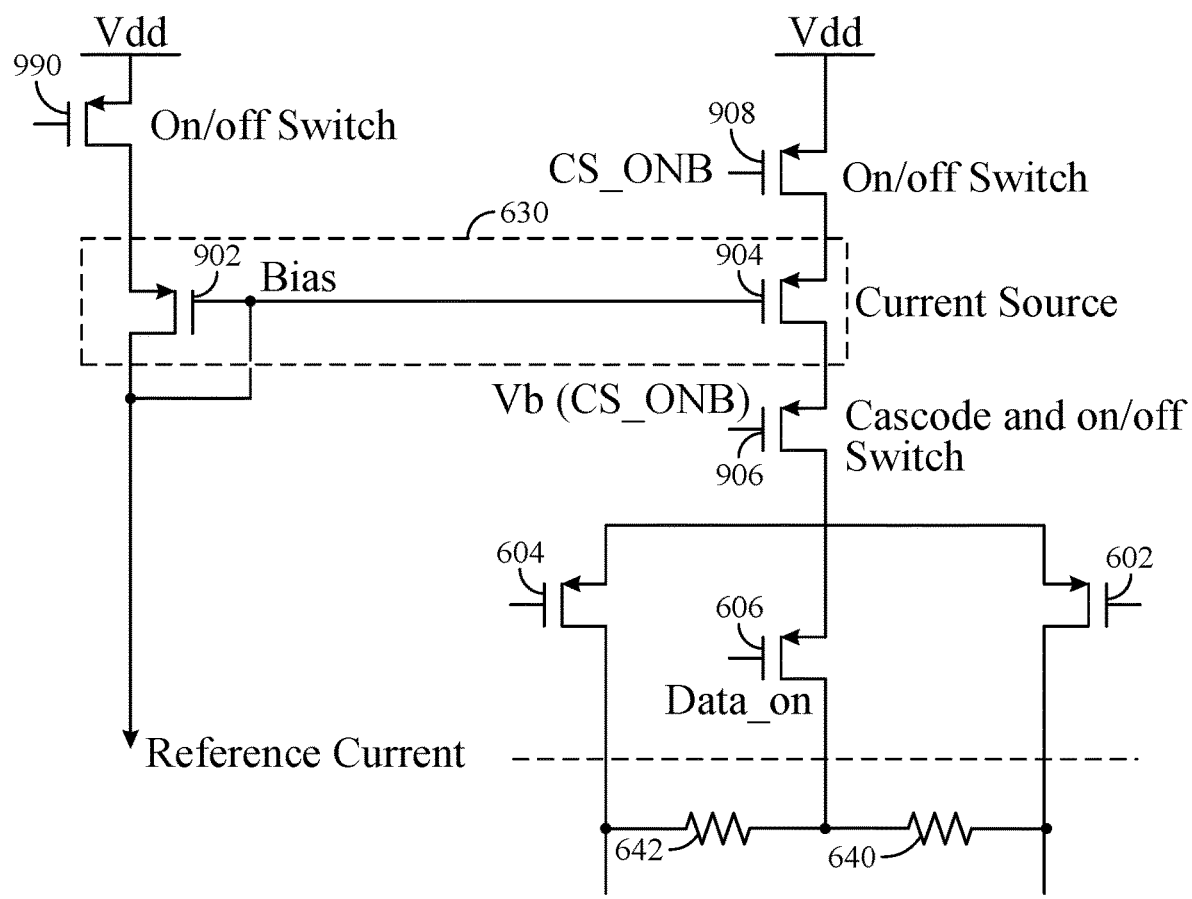
FIG. 9B illustrates example circuitry for implementing the current source toggle circuit using a triode switch, in accordance with certain aspects of the present disclosure.

FIG. 9B illustrates example circuitry for implementing the current source toggle circuit 804 using a triode switch 990, in accordance with certain aspects of the present disclosure. The triode switch 990 may be coupled between Vdd and transistor 902. The triode switch 990 may be controlled (e.g., opened or closed using CS_ONB signal) to enable or disable the current steering cell. The triode switch 990 may be implemented for the current source toggle circuit of each of the current steering cells 401. The triode switch 990 may be configured to equalize the voltage drop between Vdd and transistor 902 and the voltage drop between Vdd and transistor 904, making gains and headrooms of the current steering cells track well over process, voltage, and temperature (PVT) variations, and also reducing power consumption.

Figure 9C:
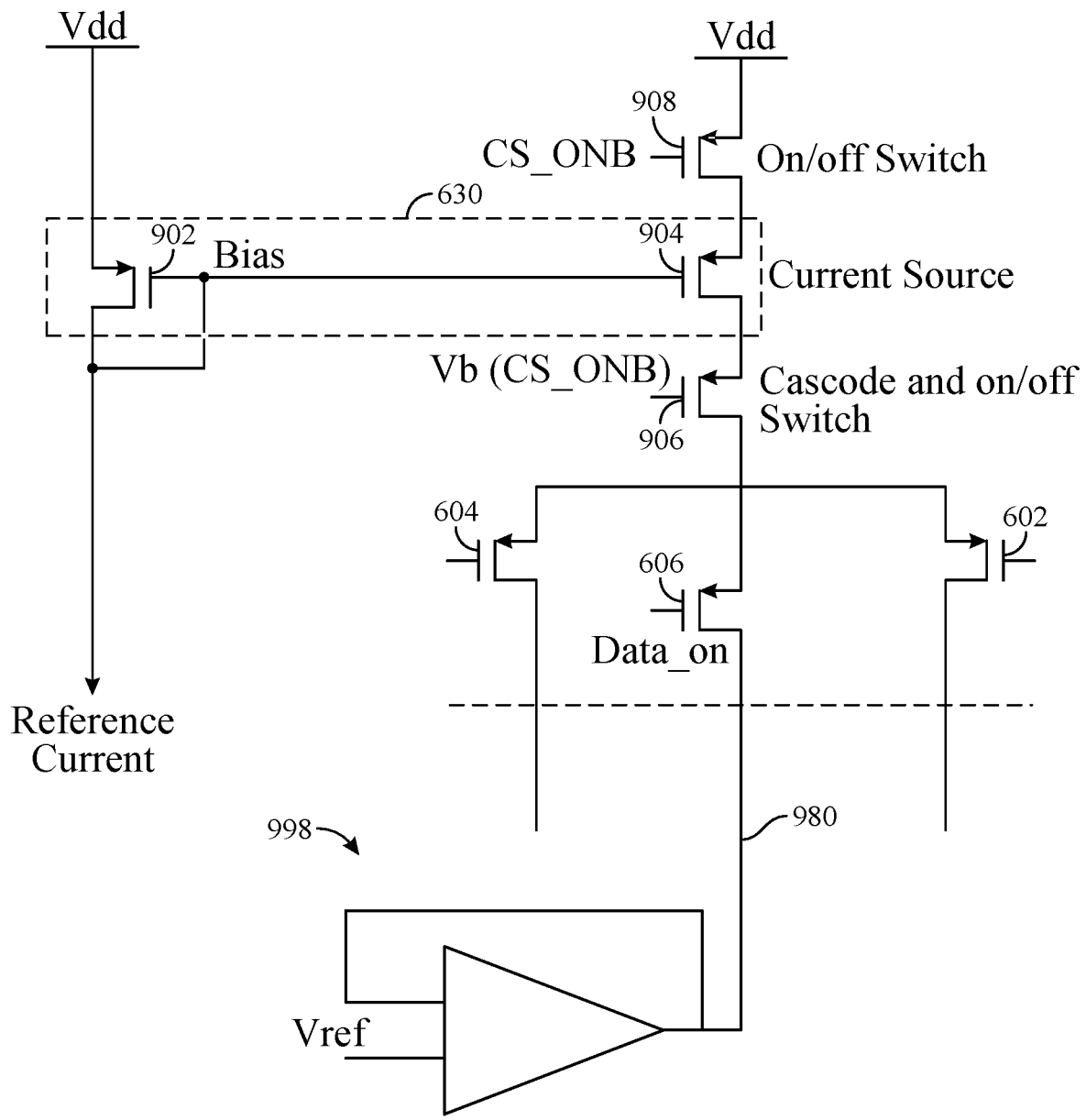
FIG. 9C illustrates a dump path for the current flow across the bypass switch, in accordance with certain aspects of the present disclosure.

FIG. 9C illustrates a dump path for the current across the bypass switch 606, in accordance with certain aspects of the present disclosure. As illustrated, an amplifier (e.g., operational transconductance amplifier (OTA)) may be implemented as a buffer 998 having an output coupled to a bypass node 980 (e.g., the drain of the transistor used to implemented bypass switch 606). For example, the amplifier may include a first input configured to receive a reference voltage (vref), and a second input coupled to the output of the amplifier. The buffer 998 may attempt to maintain Vref at the bypass node 980 to reduce distortion.

Figure 10:
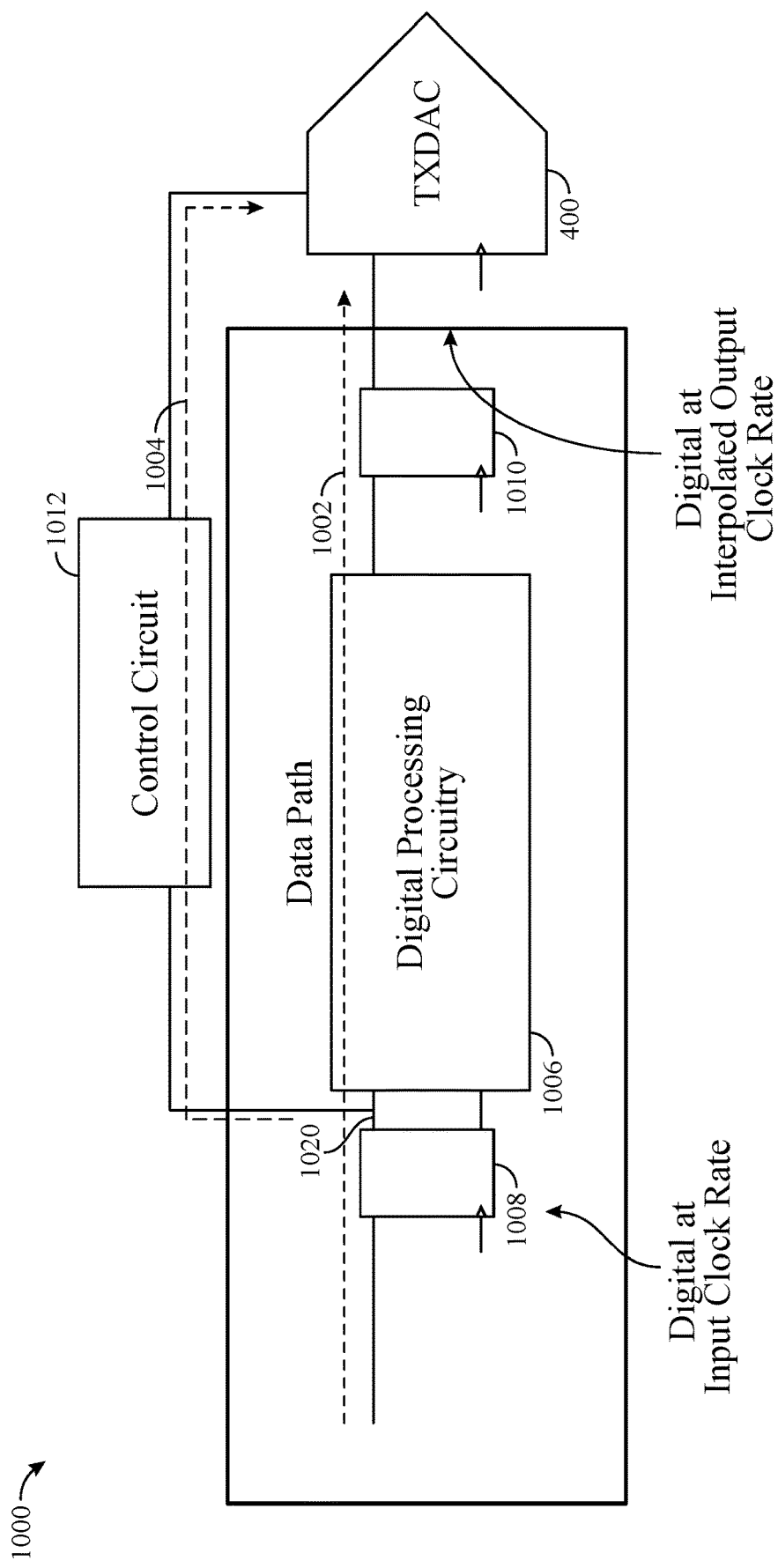
FIG. 10 illustrates a DAC system including an input path and a feedforward path coupled to a DAC, in accordance with certain aspects of the present disclosure.

FIG. 10 illustrates a DAC system 1000 including an input path 1002 and a feedforward path 1004 coupled to the DAC 400, in accordance with certain aspects of the present disclosure. As illustrated, the input path 1002 may be coupled between the input node 1020 and the DAC 400 and may include one or more digital processing circuits 1006. For example, the one or more digital processing circuits 1006 may include a transmitter DAC data processing component and one or more filtering components. The input path may also include one or more flip-flops 1008, 1010 (e.g., representing delay in the input path).

A feedforward path 1004 may be coupled between the input node 1020 and the DAC 400 and may include a control circuit 1012, as shown. The control circuit 1012 may be configured to process the DAC code and provide advance notice to the DAC 400 that the DAC code will spike and transition to the high range or the low range, as described herein. For example, the control circuit 1012 may be configured to detect that the DAC code has exceeded an upper threshold, or has transitioned below a lower threshold, and provide the advance notice to the DAC 400. In some aspects, the control circuit 1012 may determine whether the DAC code will spike to the high range or the low range based on a rate of change (e.g., slope) associated with the DAC code. For example, if the rate of change associated with the DAC code increases above a threshold, the control circuit may determine that the DAC code will transition to the high range or low range. In response, the control circuit 1012 may generate the CS_ON signal provided to the current source toggle circuit 804, as described with respect to FIG. 8. In some aspects, the delay associated with control circuit 1012 may be less than the delay associated with the input path 1002 (e.g., the delay in the one or more digital processing circuits 1006), allowing the control circuit 1012 to provide the notice regarding the spike of the DAC code in advance such that the appropriate current steering cells can be timely enabled.

In some aspects, two different clock domains, including a slow clock (e.g., a pre-interpolation clock domain) and a fast clock (e.g., a high-speed interpolated clock domain) may be used. For example, circuitry on the feedforward path 1004 (e.g., the control circuit 1012) used to generate the CS_ON signal may operate off the slow clock, reducing power consumption associated with the feedforward path. On the other hand, circuitry on the input path 1002 (e.g., digital processing circuitry 1006) used to generate the DATA_ON signal may operate off the fast clock.

Figure 11:
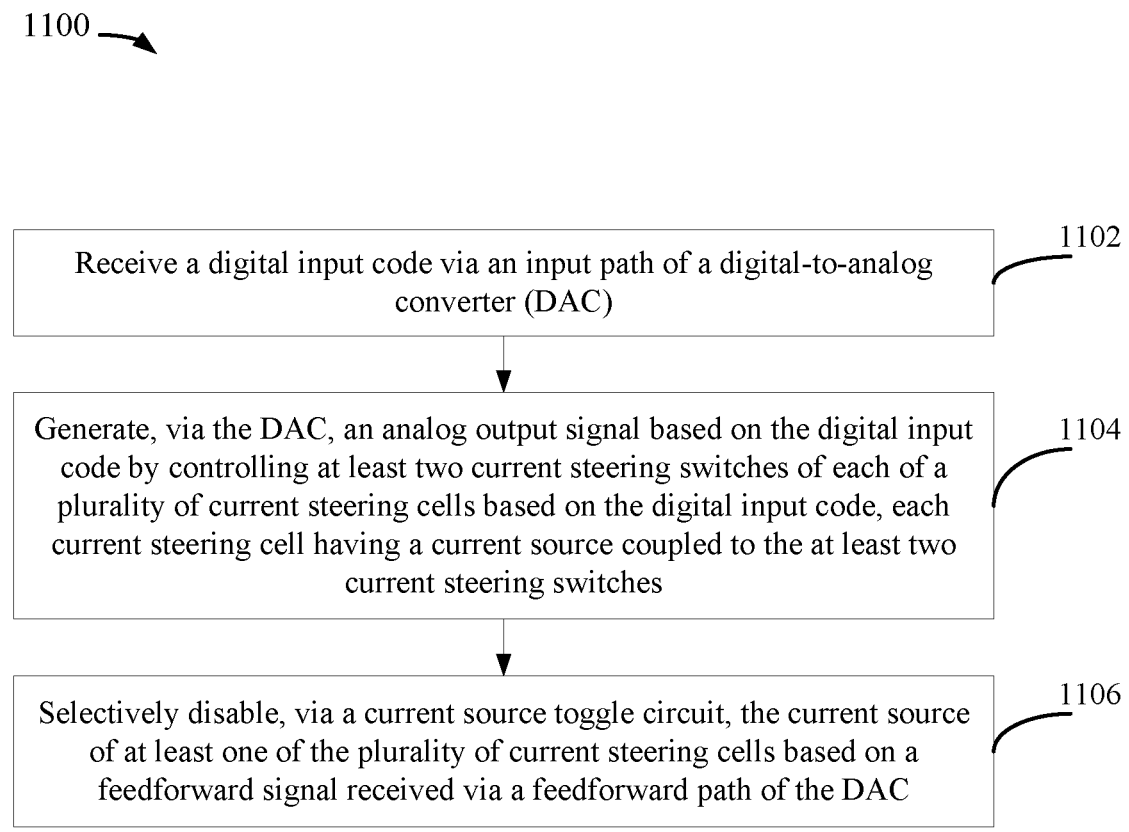
FIG. 11 is a flow diagram depicting example operations for digital-to-analog conversion, in accordance with certain aspects of the present disclosure.

FIG. 11 is a flow diagram depicting example operations 1100 for digital-to-analog conversion, in accordance with certain aspects of the present disclosure. For example, the operations 1100 may be performed by a DAC system, such as the DAC system 1000.

The operations 1100 begin, at block 1102, with the DAC system receiving a digital input code (also referred to herein as a "DAC code", "input DAC code," or "DAC input code") via an input path (e.g., input path 1002) of a DAC (e.g., DAC 400). At block 1104, the DAC system may generate, via the DAC, an analog output signal based on the digital input code by controlling at least two current steering switches (e.g., positive and negative switches 602, 604) of each of a plurality of current steering cells (e.g., current steering cells 401) based on the digital input code, each current steering cell having a current source (e.g., current source 630) coupled to the at least two current steering switches. At block 1106, the DAC system may selectively disable, via a current source toggle circuit (e.g., current source toggle circuit 804), the current source of at least one of the plurality of current steering cells based on a feedforward signal received via a feedforward path (e.g., feedforward path 1004) of the DAC.

In some aspects, the DAC system may, after disabling the current source, enable the current source in response to a control signal (e.g., CS_ON signal) from the feedforward path. In some cases, the at least one of the plurality of current steering cells may be disabled while a value of the digital input code for the DAC system is within a range (e.g., midrange as described with respect to FIG. 7). The DAC system may estimate that the value of the digital input code is to transition to a value that is higher than the range or lower than the range (e.g., transition to the high range or the low range). The DAC system may then generate the control signal to enable the current source of the at least one of the plurality of current steering cells based on the estimation. In some aspects, the at least one of the plurality of current steering cells may include one or more first current steering cells (e.g., one or more current steering cells configured to perform the digital-to-analog conversion when the digital input code is in the high range) and one or more second current steering cells (e.g., one or more other current steering cells configured to perform the digital-to-analog conversion when the digital input code is in the low range). The DAC system may enable the current source by enabling the current source of each of the one or more first current steering cells if the value of the digital input code is estimated to transition to the value that is higher than the range, or enable the current source of each of the one or more second current steering cells if the value of the digital input code is estimated to transition to the value that is lower than the range.

In some aspects, the input path may include one or more digital processing circuits (e.g., the one or more digital processing circuits 1006) coupled between an input node (e.g., the input node 1020) of the DAC system and the control inputs of the at least two current steering switches. The feedforward path may include a control circuit (e.g., control circuit 1012) coupled between the input node and the at least one control input of the current source toggle circuit. In some aspects, a delay associated with the one or more digital processing circuits may be greater than a delay associated with the control circuit.

In some aspects, the current source toggle circuit may include a first switch (e.g., transistor 908) configured to selectively disable the current source of the at least one of the plurality of current steering cells. The first switch and the current source may be coupled in series in a path between a voltage rail (e.g., Vdd of FIG. 9A) and the at least two current steering switches. In some aspects, the first switch may be coupled between the voltage rail and the current source, and the current source toggle circuit may further include a second switch (e.g., transistor 906) coupled between the current source and the at least two current steering switches.

In some aspects, each of the at least two current steering switches may include a first switch (e.g., positive switch 602) coupled between the current source and a positive output of the current steering cell, a second switch (e.g., negative switch 604) coupled between the current source and a negative output of the current steering cell, and a bypass switch (e.g., bypass switch 606) configured to provide a common-mode current to the positive and negative outputs. For example, a first resistive element may be coupled between the bypass switch and the positive output, and a second resistive element may be coupled between the bypass switch and the negative output. A first portion of the common-mode current may be provided to the positive output through the first resistive element, and a second portion of the common-mode current may be provided to the negative output through the second resistive element. In some aspects, the DAC system may, after disabling the current source, enable the current source in response to a control signal (e.g., CS_ON signal) from the feedforward path. The bypass switch may be closed at a time when the current source is enabled. The DAC system may, after a current settling delay (e.g., current source settling period 810) from the time when the current source is enabled, open the bypass switch, and close the first switch or the second switch to direct a current from the current source to the positive output or the negative output, respectively. In some aspects, estimating that the value of the digital input code is to transition to the value that is higher than the range or lower than the range may be based on a rate of change associated with the digital input code.

Example Aspects

Aspect 1. A digital-to-analog converter (DAC) system, comprising: a plurality of current steering cells, each comprising a current source coupled to at least two current steering switches, wherein control inputs of the at least two current steering switches are coupled to an input path of the DAC system; a current source toggle circuit configured to selectively disable the current source of at least one of the plurality of current steering cells; and a feedforward path coupled between the input path and at least one control input of the current source toggle circuit.

Aspect 2. The DAC system of aspect 1, wherein: the input path comprises one or more digital processing circuits coupled between an input node of the DAC system and the control inputs of the at least two current steering switches; the feedforward path comprises a control circuit coupled between the input node and the at least one control input of the current source toggle circuit; and a delay associated with the one or more digital processing circuits is greater than a delay associated with the control circuit.

Aspect 3. The DAC system of any one of aspects 1-2, wherein: the current source toggle circuit comprises a first switch configured to selectively disable the current source of the at least one of the plurality of current steering cells; and the first switch and the current source are coupled in series in a path between a voltage rail and the at least two current steering switches.

Aspect 4. The DAC system of aspect 3, wherein: the first switch is coupled between the voltage rail and the current source; and the current source toggle circuit further comprises a second switch coupled between the current source and the at least two current steering switches.

Aspect 5. The DAC system of any one of aspects 1-4, wherein each of the at least two current steering switches includes: a first switch coupled between the current source and a positive output of the current steering cell; a second switch coupled between the current source and a negative output of the current steering cell; and a bypass switch coupled between the current source and a bypass node.

Aspect 6. The DAC system of aspect 5, wherein the bypass switch is configured to provide a common-mode current to the positive and negative outputs.

Aspect 7. The DAC system of aspect 6, further comprising: a first resistive element coupled between the bypass switch and the positive output; and a second resistive element coupled between the bypass switch and the negative output, wherein: a first portion of the common-mode current is configured to flow to the positive output through the first resistive element; and a second portion of the common-mode current is configured to flow to the negative output through the second resistive element.

Aspect 8. The DAC system of any one of aspects 6-7, further comprising a resistor ladder circuit having multiple segments, each segment having a first resistive element and a second resistive element, wherein the bypass switch is configured to selectively provide the common-mode current to the bypass node between the first resistive element and the second resistive element of a respective one of the multiple segments.

Aspect 9. The DAC system of any one of aspects 5-8, wherein the current source toggle circuit is configured to: disable the current source of the at least one of the plurality of current steering cells; and after disabling the current source, enable the current source in response to a control signal from the feedforward path, wherein the bypass switch is configured to be closed at a time when the current source is enabled.

Aspect 10. The DAC system of aspect 9, wherein, after a current settling delay from the time when the current source is enabled: the bypass switch is configured to be opened; and the first switch or the second switch is configured to be closed to direct a current from the current source to the positive output or the negative output, respectively.

Aspect 11. The DAC system of any one of aspects 1-10, wherein the current source toggle circuit is configured to: disable the current source of the at least one of the plurality of current steering cells; and after disabling the current source, enable the current source in response to a control signal from the feedforward path.

Aspect 12. The DAC system of aspect 11, wherein the at least one of the plurality of current steering cells is disabled while a value of an input DAC code for the DAC system is within a range, and wherein the feedforward path comprises a control circuit configured to: estimate that the value of the input DAC code is to transition to a value that is higher than the range or lower than the range; and generate the control signal to enable the current source of the at least one of the plurality of current steering cells based on the estimation.

Aspect 13. The DAC system of aspect 12, wherein: the at least one of the plurality of current steering cells comprises one or more first current steering cells and one or more second current steering cells; and enabling the current source comprises: enabling the current source of each of the one or more first current steering cells if the value of the input DAC code is estimated to transition to the value that is higher than the range; or enabling the current source of each of the one or more second current steering cells if the value of the input DAC code is estimated to transition to the value that is lower than the range.

Aspect 14. The DAC system of any one of aspects 12-13, wherein the control circuit is configured to estimate that the value of the input DAC code is to transition to the value that is higher than the range or lower than the range based on a rate of change associated with the input DAC code.

Aspect 15. The DAC system of any one of aspects 1-14, wherein the feedforward path comprises a control circuit configured to generate a control signal to selectively disable the current source, wherein the input path comprises digital processing circuitry configured to control the at least two current steering switches, and wherein the control circuit is configured to operate on a slower clock signal than the digital processing circuitry.

Aspect 16. A wireless device having a transmit path comprising the DAC system of any one of aspects 1-15.

Aspect 17. The DAC system of any one of aspects 1-16, wherein the current source comprises a current mirror having: a transistor coupled to the at least two current steering switches; a diode-connected transistor having a gate coupled to the gate of the transistor; and a switch coupled between a voltage rail and the diode-connected transistor.

Aspect 18. A method for digital-to-analog conversion, comprising: receiving a digital input code via an input path of a digital-to-analog converter (DAC); generating, via the DAC, an analog output signal based on the digital input code by controlling at least two current steering switches of each of a plurality of current steering cells based on the digital input code, each current steering cell having a current source coupled to the at least two current steering switches; and selectively disabling, via a current source toggle circuit, the current source of at least one of the plurality of current steering cells based on a feedforward signal received via a feedforward path of the DAC, the feedforward path being coupled between the input path and the current source toggle circuit.

Aspect 19. The method of aspect 18, further comprising, after disabling the current source, enabling the current source in response to a control signal from the feedforward path.

Aspect 20. The method of aspect 19, wherein the at least one of the plurality of current steering cells is disabled while a value of the digital input code is within a range, the method further comprising: estimating that the value of the digital input code is to transition to a value that is higher than the range or lower than the range; and generating the control signal to enable the current source of the at least one of the plurality of current steering cells based on the estimation.

Aspect 21. The method of aspect 20, wherein: the at least one of the plurality of current steering cells comprises one or more first current steering cells and one or more second current steering cells; and enabling the current source comprises: enabling the current source of each of the one or more first current steering cells if the value of the digital input code is estimated to transition to the value that is higher than the range; or enabling the current source of each of the one or more second current steering cells if the value of the digital input code is estimated to transition to the value that is lower than the range.

Aspect 22. The method of any one of aspects 18-21, wherein: the input path comprises one or more digital processing circuits coupled between an input node and control inputs of the at least two current steering switches; the feedforward path comprises a control circuit coupled between the input node and at least one control input of the current source toggle circuit; and a delay associated with the one or more digital processing circuits is greater than a delay associated with the control circuit.

Aspect 23. The method of any one of aspects 18-22, wherein: the current source toggle circuit comprises a first switch configured to selectively disable the current source of the at least one of the plurality of current steering cells; and the first switch and the current source are coupled in series in a path between a voltage rail and the at least two current steering switches.

Aspect 24. The method of aspect 23, wherein: the first switch is coupled between the voltage rail and the current source; and the current source toggle circuit further comprises a second switch coupled between the current source and the at least two current steering switches.

Aspect 25. The method of any one of aspects 18-24, wherein each of the at least two current steering switches includes: a first switch coupled between the current source and a positive output of the current steering cell; a second switch coupled between the current source and a negative output of the current steering cell; and a bypass switch configured to provide a common-mode current to the positive and negative outputs.

Aspect 26. The method of aspect 25, wherein: a first resistive element is coupled between the bypass switch and the positive output; a second resistive element is coupled between the bypass switch and the negative output; a first portion of the common-mode current is provided to the positive output through the first resistive element; and a second portion of the common-mode current is provided to the negative output through the second resistive element.

Aspect 27. The method of any one of aspects 25-26, further comprising, after disabling the current source, enabling the current source in response to a control signal from the feedforward path, wherein the bypass switch is closed at a time when the current source is enabled.

Aspect 28. The method of aspect 27, further comprising, after a current settling delay from the time when the current source is enabled: opening the bypass switch; and closing the first switch or the second switch to direct a current from the current source to the positive output or the negative output, respectively.

Aspect 29. The method of any one of aspects 20-28, wherein estimating that the value of the digital input code is to transition to the value that is higher than the range or lower than the range is based on a rate of change associated with the digital input code.

Aspect 30. An apparatus for digital-to-analog conversion, comprising: means for generating an analog output signal based on a digital input code received via an input path, wherein the means for generating includes means for controlling at least two current steering switches of each of a plurality of current steering cells based on the digital input code, each current steering cell having a current source coupled to the at least two current steering switches; and means for selectively disabling the current source of at least one of the plurality of current steering cells based on a feedforward signal received via a feedforward path of the means for generating, the feedforward path being coupled between the input path and the means for selectively disabling.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." For example, means for generating an analog output signal may include a DAC, such as the DAC 400. Means for controlling may include an input path, such as the input path 1002. Means for selectively disabling and means for enabling may include a current source toggle circuit, such as the current source toggle circuit 804 (e.g., transistor 906 or 908, or both transistors 906, 908). Means for estimating and means for generating may include a control circuit, such as the control circuit 1012.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A digital-to-analog converter (DAC) system, comprising:
   a plurality of current steering cells, each comprising a current source coupled to at least two current steering switches, wherein control inputs of the at least two current steering switches are coupled to an input path of the DAC system;
   a current source toggle circuit configured to selectively disable the current source of at least one of the plurality of current steering cells; and
   a feedforward path coupled between the input path and at least one control input of the current source toggle circuit, wherein the input path comprises one or more digital processing circuits coupled between an input node of the DAC system and the control inputs of the at least two current steering switches, wherein the feedforward path comprises a control circuit coupled between the input node and the at least one control input of the current source toggle circuit, and wherein a delay associated with the one or more digital processing circuits is greater than a delay associated with the control circuit.

2. The DAC system of claim 1, wherein:
   the current source toggle circuit comprises a first switch configured to selectively disable the current source of the at least one of the plurality of current steering cells; and
   the first switch and the current source are coupled in series in a path between a voltage rail and the at least two current steering switches.

3. The DAC system of claim 2, wherein:
   the first switch is coupled between the voltage rail and the current source; and
   the current source toggle circuit further comprises a second switch coupled between the current source and the at least two current steering switches.

4. The DAC system of claim 1, wherein each of the at least two current steering switches includes:
   a first switch coupled between the current source and a positive output of the current steering cell;
   a second switch coupled between the current source and a negative output of the current steering cell; and
   a bypass switch coupled between the current source and a bypass node.

5. The DAC system of claim 4, wherein the bypass switch is configured to provide a common-mode current to the positive and negative outputs.

6. The DAC system of claim 5, further comprising:
   a first resistive element coupled between the bypass switch and the positive output; and
   a second resistive element coupled between the bypass switch and the negative output, wherein:
      a first portion of the common-mode current is configured to flow to the positive output through the first resistive element; and
      a second portion of the common-mode current is configured to flow to the negative output through the second resistive element.

7. The DAC system of claim 5, further comprising a resistor ladder circuit having multiple segments, each segment having a first resistive element and a second resistive element, wherein the bypass switch is configured to selectively provide the common-mode current to the bypass node between the first resistive element and the second resistive element of a respective one of the multiple segments.

8. The DAC system of claim 4, wherein the current source toggle circuit is configured to:
   disable the current source of the at least one of the plurality of current steering cells; and
   after disabling the current source, enable the current source in response to a control signal from the feedforward path, wherein the bypass switch is configured to be closed at a time when the current source is enabled.

9. The DAC system of claim 8, wherein, after a current settling delay from the time when the current source is enabled:
   the bypass switch is configured to be opened; and
   the first switch or the second switch is configured to be closed to direct a current from the current source to the positive output or the negative output, respectively.

10. The DAC system of claim 1, wherein the current source toggle circuit is configured to:
    disable the current source of the at least one of the plurality of current steering cells; and
    after disabling the current source, enable the current source in response to a control signal from the feedforward path.

11. The DAC system of claim 10, wherein the at least one of the plurality of current steering cells is disabled while a value of an input DAC code for the DAC system is within a range, and wherein the control circuit of the feedforward path is configured to:
    estimate that the value of the input DAC code is to transition to a value that is higher than the range or lower than the range; and
    generate the control signal to enable the current source of the at least one of the plurality of current steering cells based on the estimation.

12. The DAC system of claim 11, wherein:
    the at least one of the plurality of current steering cells comprises one or more first current steering cells and one or more second current steering cells; and
    enabling the current source comprises:
       enabling the current source of each of the one or more first current steering cells if the value of the input DAC code is estimated to transition to the value that is higher than the range; or
       enabling the current source of each of the one or more second current steering cells if the value of the input DAC code is estimated to transition to the value that is lower than the range.

13. The DAC system of claim 11, wherein the control circuit is configured to estimate that the value of the input DAC code is to transition to the value that is higher than the range or lower than the range based on a rate of change associated with the input DAC code.

14. The DAC system of claim 1, wherein the control circuit is configured to operate on a slower clock signal than the one or more digital processing circuits.

15. A wireless device having a transmit path comprising the DAC system of claim 1.

16. The DAC system of claim 1, wherein the current source comprises a current mirror having:
- a transistor coupled to the at least two current steering switches;
- a diode-connected transistor having a gate coupled to the gate of the transistor; and
- a switch coupled between a voltage rail and the diode-connected transistor.

17. A method for digital-to-analog conversion, comprising:
- receiving a digital input code via an input path of a digital-to-analog converter (DAC);
- generating, via the DAC, an analog output signal based on the digital input code by controlling at least two current steering switches of each of a plurality of current steering cells based on the digital input code, each current steering cell having a current source coupled to the at least two current steering switches; and
- selectively disabling, via a current source toggle circuit, the current source of at least one of the plurality of current steering cells based on a feedforward signal received via a feedforward path of the DAC, the feedforward path being coupled between the input path and the current source toggle circuit;
- after disabling the current source, enabling the current source in response to a control signal from the feedforward path, wherein the current source of the at least one of the plurality of current steering cells is disabled while a value of the digital input code is within a range, wherein the method further comprises:
- estimating that the value of the digital input code is to transition to a value that is higher than the range or lower than the range; and
- generating the control signal to enable the current source of the at least one of the plurality of current steering cells based on the estimation.

18. The method of claim 17, wherein:
- the at least one of the plurality of current steering cells comprises one or more first current steering cells and one or more second current steering cells; and
- enabling the current source comprises:
  - enabling the current source of each of the one or more first current steering cells if the value of the digital input code is estimated to transition to the value that is higher than the range; or
  - enabling the current source of each of the one or more second current steering cells if the value of the digital input code is estimated to transition to the value that is lower than the range.

19. The method of claim 17, wherein:
- the input path comprises one or more digital processing circuits coupled between an input node and control inputs of the at least two current steering switches;
- the feedforward path comprises a control circuit coupled between the input node and at least one control input of the current source toggle circuit; and
- a delay associated with the one or more digital processing circuits is greater than a delay associated with the control circuit.

20. The method of claim 17, wherein:
- the current source toggle circuit comprises a first switch configured to selectively disable the current source of the at least one of the plurality of current steering cells; and
- the first switch and the current source are coupled in series in a path between a voltage rail and the at least two current steering switches.

21. The method of claim 20, wherein:
- the first switch is coupled between the voltage rail and the current source; and
- the current source toggle circuit further comprises a second switch coupled between the current source and the at least two current steering switches.

22. The method of claim 17, wherein each of the at least two current steering switches includes:
- a first switch coupled between the current source and a positive output of the current steering cell;
- a second switch coupled between the current source and a negative output of the current steering cell; and
- a bypass switch configured to provide a common-mode current to the positive and negative outputs.

23. The method of claim 22, wherein:
- a first resistive element is coupled between the bypass switch and the positive output;
- a second resistive element is coupled between the bypass switch and the negative output;
- a first portion of the common-mode current is provided to the positive output through the first resistive element; and
- a second portion of the common-mode current is provided to the negative output through the second resistive element.

24. The method of claim 22, further comprising, after disabling the current source, enabling the current source in response to a control signal from the feedforward path, wherein the bypass switch is closed at a time when the current source is enabled.

25. The method of claim 24, further comprising, after a current settling delay from the time when the current source is enabled:
- opening the bypass switch; and
- closing the first switch or the second switch to direct a current from the current source to the positive output or the negative output, respectively.

26. The method of claim 17, wherein estimating that the value of the digital input code is to transition to the value that is higher than the range or lower than the range is based on a rate of change associated with the digital input code.

27. An apparatus for digital-to-analog conversion, comprising:
- means for generating an analog output signal based on a digital input code received via an input path, wherein the means for generating includes means for controlling at least two current steering switches of each of a plurality of current steering cells based on the digital input code, each current steering cell having a current source coupled to the at least two current steering switches; and
- means for selectively disabling the current source of at least one of the plurality of current steering cells based on a feedforward signal received via a feedforward path of the means for generating, the feedforward path being coupled between the input path and the means for selectively disabling, wherein the input path comprises one or more digital processing circuits coupled between an input node and the means for controlling the at least two current steering switches, wherein a delay associated with the one or more digital processing circuits is greater than a delay associated with the means for selectively disabling the current source.

28. A digital-to-analog converter (DAC) system, comprising:
- a plurality of current steering cells, each comprising a current source coupled to at least two current steering switches, wherein control inputs of the at least two current steering switches are coupled to an input path of the DAC system;
- a current source toggle circuit configured to selectively disable the current source of at least one of the plurality of current steering cells; and
- a feedforward path coupled between the input path and at least one control input of the current source toggle circuit, wherein the current source toggle circuit comprises a first switch configured to selectively disable the current source of the at least one of the plurality of current steering cells, wherein the first switch and the current source are coupled in series in a path between a voltage rail and the at least two current steering switches, wherein the first switch is coupled between the voltage rail and the current source, and wherein the current source toggle circuit further comprises a second switch coupled between the current source and the at least two current steering switches.

29. A digital-to-analog converter (DAC) system, comprising:
- a plurality of current steering cells, each comprising a current source coupled to at least two current steering switches, wherein control inputs of the at least two current steering switches are coupled to an input path of the DAC system;
- a current source toggle circuit configured to selectively disable the current source of at least one of the plurality of current steering cells; and
- a feedforward path coupled between the input path and at least one control input of the current source toggle circuit, wherein the current source toggle circuit is configured to:
- disable the current source of the at least one of the plurality of current steering cells; and
- after disabling the current source, enable the current source in response to a control signal from the feedforward path, wherein the current source of the at least one of the plurality of current steering cells is disabled while a value of an input DAC code for the DAC system is within a range, and wherein the feedforward path comprises a control circuit configured to:
- estimate that the value of the input DAC code is to transition to a value that is higher than the range or lower than the range; and
- generate the control signal to enable the current source of the at least one of the plurality of current steering cells based on the estimation.

30. A digital-to-analog converter (DAC) system, comprising:
- a plurality of current steering cells, each comprising a current source coupled to at least two current steering switches, wherein control inputs of the at least two current steering switches are coupled to an input path of the DAC system;
- a current source toggle circuit configured to selectively disable the current source of at least one of the plurality of current steering cells; and
- a feedforward path coupled between the input path and at least one control input of the current source toggle circuit, wherein the feedforward path comprises a control circuit configured to generate a control signal to selectively disable the current source, wherein the input path comprises digital processing circuitry configured to control the at least two current steering switches, and wherein the control circuit is configured to operate on a slower clock signal than the digital processing circuitry.

* * * * *